(12) United States Patent
Stadel et al.

(10) Patent No.: US 7,168,447 B2
(45) Date of Patent: Jan. 30, 2007

(54) FLUID DISTRIBUTION UNIT FOR DIVIDING A STREAM OF FLUID INTO A PLURALITY OF PARTIAL STREAMS

(75) Inventors: Oliver Stadel, Wendeburg (DE); Jürgen Schmidt, Braunschweig (DE); Ulrich Krause, Braunschweig (DE)

(73) Assignee: Technische Universitat Carolo-Wilhelmina Zu, Braunschweig (DE)

( * ) Notice: Subject to any disclaimer, the term of this patent is extended or adjusted under 35 U.S.C. 154(b) by 509 days.

(21) Appl. No.: 10/433,039

(22) PCT Filed: Jan. 8, 2002

(86) PCT No.: PCT/EP02/00097

§ 371 (c)(1),
(2), (4) Date: Dec. 4, 2003

(87) PCT Pub. No.: WO02/055757

PCT Pub. Date: Jul. 18, 2002

(65) Prior Publication Data

US 2004/0094090 A1    May 20, 2004

(30) Foreign Application Priority Data

Jan. 9, 2001  (DE) ................................ 101 00 670

(51) Int. Cl.
*F16L 41/00*     (2006.01)
*C23C 16/00*     (2006.01)

(52) U.S. Cl. .................. 137/561 A; 137/828; 137/833; 137/340; 118/715; 118/725

(58) Field of Classification Search ............ 137/561 A, 137/828, 833, 340; 118/715, 724, 725
See application file for complete search history.

(56) References Cited

U.S. PATENT DOCUMENTS 2,734,224 A  *  2/1956  Winstead .................... 425/190

(Continued)

FOREIGN PATENT DOCUMENTS

DE          41 20 176 C1     2/1992

(Continued)

*Primary Examiner*—A. Michael Chambers
(74) *Attorney, Agent, or Firm*—Salter & Michaelson

(57) ABSTRACT

The invention relates to a liquid distribution unit (10, 20) for dividing a liquid current into a plurality of partial currents. Said unit comprises at least one liquid inlet (13, 23) for the supplied liquid current, a plurality of liquid outlets (14; 24) for the partial currents, and a plurality of channels (15, 25) connecting the liquid inlets (13, 23) to the liquid outlets (14, 24). Said unit is characterised in that the channels (15, 25) symmetrically and respectively branch off (16, 26) into upstream channels (15a, 15b, 15c, 15d, 15c; 25a, 25b, 25c, 25d, 25c) and each connection leading from the liquid inlet (13; 23 ) to one of the liquid outlets (14; 24) comprises the same channels (15, 25) and the same branches (16, 26). A liquid distribution device for the divided distributiion of at least two different liquids; comprises a plurality of such liquid distribution units (10, 20) placed flatly on top of each other. One of the liquids is distributed in each liquid distribution unit (10, 20) and the other(s) is/are guided through separate passages (17, 27) in an undistributed manner. One such liquid distribution device can especially be embodied as a device for supplying gases for a CVD coating installation. In this case, at least one liquid distribution unit (10) is provided for a precursor gas optionally having a carrier gas, and at least one other liquid distribution unit (20) is provided for a reactive gas.

24 Claims, 5 Drawing Sheets

Figure 1A:
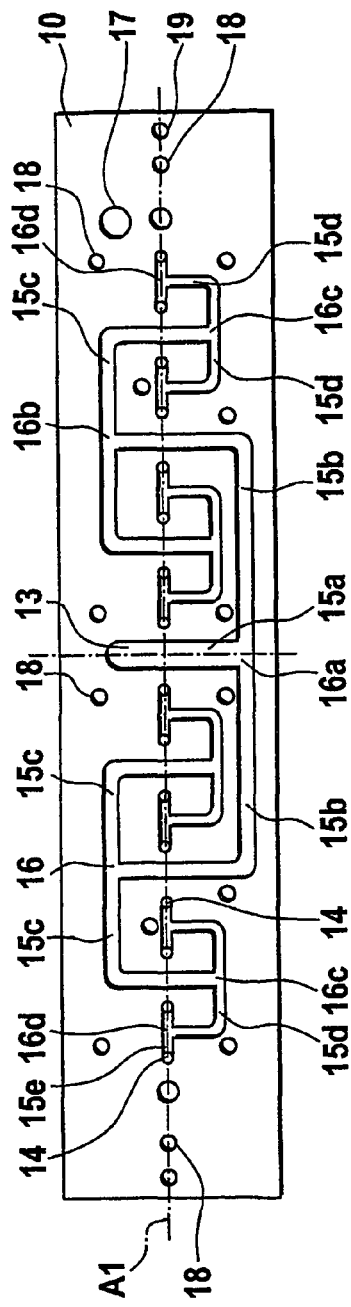

U.S. PATENT DOCUMENTS 3,936,262 A * 2/1976 Hehl .................... 425/568
5,324,361 A    6/1994 Etzkorn et al.
5,595,606 A    1/1997 Fujikawa et al.
5,622,606 A    4/1997 Kugler et al.
5,624,498 A    4/1997 Lee et al.
5,992,453 A * 11/1999 Zimmer ................ 137/561 A
6,086,677 A    7/2000 Umotoy et al.
6,481,453 B1 * 11/2002 O'Connor et al. ....... 137/15.04

FOREIGN PATENT DOCUMENTS

DE    44 12 541 A1    10/1994
JP    61263118        11/1986

* cited by examiner

FLUID DISTRIBUTION UNIT FOR DIVIDING A STREAM OF FLUID INTO A PLURALITY OF PARTIAL STREAMS

The invention relates to a fluid distribution unit for dividing a stream of fluid into a plurality of partial streams including at least one fluid inlet for the incoming stream of fluid, a plurality of fluid outlets for the partial streams and a plurality of channels which connect the fluid inlet to the fluid outlets. Moreover, the invention relates to a fluid distribution device for separately distributing two or more different fluids.

A practical case of application for such fluid distribution devices are the supply devices used for supplying a stream of gas to a CVD (Chemical Vapour Deposition) coating plant i.e. a coating plant utilising chemical gas phase deposition. In the case of CVD coating plants, the material that is to be applied is generally supplied in the form of a chemical compound which is referred to as the preliminary compound or precursor. The precursor is supplied in the form of a precursor gas, possibly together with a carrier gas, to the CVD coating plant where it then meets a separately supplied reaction gas, reacts therewith and liberates the component which is to be applied to the substrate.

In order to enable the desired layer of material to be distributed over the entire surface of the substrate so as to have a uniform chemical composition and be of uniform fitness, it is desirable that the precursor gas, and also advantageously the carrier gas, be supplied in as uniform a manner as possible. In particular hereby, the speed of flow, the flow profile and the direction of flow as well as the temperature of the individual gas streams emerging from the gas outlets should be as similar as possible. The same conditions must be established in the jets, especially in the case of the continuous coating process involved in a continuous procedure.

For example, in the case of the procedure known from U.S. Pat. Nos. 5,624,498 and 6,086,677, the precursor gas stream is initially supplied to a larger collecting container, a large tube for example, which has various gas outlets equipped with jets leading away therefrom. Consequently, this concept is referred to as a "gas shower" (shower head). The intention behind the use of this large collecting container is that a static pressure that is as uniform as possible should be established at the various outlets of the collecting container so that virtually identical, uniform streams will emerge from the gas outlets.

However, the problem with such a supply device is that even when using a large collecting container, differing dynamic and static pressure ratios could occur since the various gas outlets are located at differing distances from the gas inlet of the collecting container. Consequently, the speed at which the gases emerge from the gas outlets that are arranged more closely to the gas inlet of the collecting container will be greater than it is for those outlets located more distantly therefrom.

The relatively long and, moreover, variable and difficult to predict or to calculate period (the dwelling period) for which the gases remain in the "gas shower" is also unfavourable. In particular, in the case of easily degradable and sensitive organic compounds, an undesirable decomposition process and possible separation of the components of the precursor gas may occur in the collecting container. In the case where gases are supplied at different rates when using a supply device of this type, the profile of the outlet streams emerging from the various jets may not be uniform when the gas supply rates are higher, whilst an undesirable decomposition process may occur when the supply rates are lower and the precursor thereby remains for still longer periods in the collecting container. Furthermore, the desirable feature of being able to control the temperature of the gas stream in the collecting container and in the jets is problematical.

It is also possible to regulate the gas stream emerging from the various gas outlets by controlling the individual jets which are inserted into the respective gas outlets. In particular hereby, those jets subjected to a higher gas pressure could be formed with smaller cross-sections than those jets subjected to a lower gas pressure. A certain equalisation of the speeds of the outlet stream from the various jets can in fact be achieved hereby; however, in general, an adjustment of this type is only possible for certain gas supply rates, certain gas outlet speeds and certain temperatures. If there is an alteration in these parameters, then it is necessary to effect a corresponding and complex adjustment to the settings of the relevant jets. In addition, the flow profiles of the individual gas streams emerging from the respective jets may differ from one another even if the average outlet speed is the same for all the jets. Furthermore, the periods for which the gas remains in the region between the gas supply source and the individual jets differs.

Furthermore, a diffuser device may be used for equalising the gas streams, this comprising a metal plate having uniform holes therein for example. However, in the case of a diffuser device of this type, turbulences may occur in the gas stream, whilst longer dwell periods for portions of the gas stream and undesirable separation or premature gas phase reactions may occur. A comparable concept is proposed in U.S. Pat. No. 5,595,606 for example. Here, an attempt is made to achieve uniform control of the temperature and thus better control of the stream by additionally using a cleverly deigned arrangement consisting of a plurality of heating devices.

In contrast thereto, the object of the invention is to propose a fluid distribution unit that is improved with respect to the state of the art.

A further object is to provide a fluid distribution device that is also suitable for use with a plurality of fluids that are to be distributed separately and which is constructed in as simple manner as possible.

In accordance with the invention, the first object is achieved in that the channels divide into respective branches in symmetrical manner in succeeding channels and in that each connection from the fluid inlet to one of the fluid outlets comprises similar channels and similar branches.

The second object is achieved by means of a fluid distribution device for separately distributing two or more different fluids comprising a plurality of fluid distribution units respectively corresponding to the type mentioned hereinabove which are layered flatly one above the other, wherein one of the fluids is divided up in the fluid distribution units and the other or the others are fed through ducts that are separated therefrom in an undivided manner.

Preferred embodiments are specified in the appendant claims.

Hereby, the fluids may be liquids but could also be gases or mixtures of gases. Thus the fluid distribution units or devices in accordance with the invention could be employed not only for supplying one or more gases (a precursor gas with or without a carrier gas, a reactive gas), but they could also be used for the distribution of completely different types of gases or mixtures of gases or liquids which, for example, need to be supplied to a reaction chamber in as uniform, precise and/or predictable manner as possible.

In the case of the aforementioned CVD coating plants, the invention ensures, in particular, that the outflow conditions of the gas stream will be same at all the gas outlets. Hereby, it is advantageous that the speed of the outflow, the direction of the outflow and the temperature of the gas stream at each gas outlet will be the same. Advantageously, this applies for both a precursor gas stream and also a carrier gas stream. The fluid distribution unit in accordance with the invention can be produced relatively economically, especially when employed as a supply device for CVD coating plants. The use of sensitive precursors, for high-temperature superconductors for example, can also be ensured in the case of a continuous procedure without giving rise to any undesirable separation effects.

Hereby, branches wherein the stream of fluid is fed in different directions, to the left and to the right for example, are also considered to be similar branchings of the respective channels into successive channels since the hydrodynamic flow conditions are the same. In particular, these could be T-shaped branches wherein the fluid stream is passed on at right angles in two mutually opposed directions.

The concept underlying the invention is that of producing multiple branching of the fluid channels for each partial stream from the fluid inlet to one of the fluid outlets in as symmetrical a manner as possible and thereby producing uniform conditions without resorting to an intermediate storage arrangement for the stream of fluid. Thus, in accordance with the invention, symmetrical branches are used which respectively lead to similar succeeding channels or sub-channels and these in turn branch symmetrically in corresponding manner into further succeeding channels until sufficient branchings have occurred as to reach the requisite number of fluid outlets. In consequence, alterations in pressure at the points of transition between the channels and the succeeding channels will be the same in all of the branches so that the periods for which the partial streams remain in the respective channels or the succeeding channels will likewise be the same.

It is preferable that the channels and branches be formed in a plane so that a planar structure of channels, branches and succeeding channels will be obtained and this will produce a meandering movement of the individual partial streams. The channels, branches and succeeding channels may thus be formed in a plate, in particular, one that is made of metal of high thermal conductivity, for example, a metal such as aluminium, copper, brass or steel. Hereby, a uniform temperature can be ensured in the individual channels, branches and jets by appropriately controlling the temperature of the metal plate.

The channels may, for example, be in the form of grooves in a metal plate which are covered and sealed by means of an adjoining plate except for the fluid inlet and the fluid outlets. It is thus possible to produce them relatively economically without the need to weld individual metal pipes together in respectively similar positions for example.

In the case of a fluid distribution device for a plurality of fluids that need to be supplied separately and to be distributed separately, a precursor gas with or without a carrier gas and a reactive, gas for example, one metal plate may be used for distributing a first fluid and a further metal plate used for distributing the other fluid wherein at least the channels in one plate are covered by the other one. Furthermore, the channels in the second fluid distribution unit that is in the form of a metal plate may, for example, be covered by seating thereon a succeeding temperature controlling device in which temperature controlling channels are formed for the purposes of controlling the temperature.

It is thus possible to produce a fluid distribution device for a plurality of different fluids in accordance with the invention which is of compact construction and is used for a CVD coating plants for example, wherein merely a precursor gas or a precursor gas and a carrier gas is used in addition to a reactive gas.

In the case of a construction wherein the channels are branched into two similar channels on each occasion, it is possible to construct a fluid distribution unit which has a number of fluid outlets that follow a square law, for example 8, 16 or 32 fluid outlets.

By using the fluid distribution unit in accordance with the invention, differing fluid supply rates and thus different fluid outlet rates can thus be achieved unproblematically since the speeds of the fluid streams in the channels and in the succeeding channels are merely increased correspondingly without thereby creating undesirable flow effects for the different supply rates such as occur in conventional collecting containers. Furthermore, since the fluid stream flows continuously through the channels and the respective succeeding channels, decomposition and separation effects can be avoided.

It is preferable that the pressure gradients along each of the channels be kept virtually constant or that the flow resistances between the branches be virtually the same. Thus, there will not be a locally high flow resistance which could cause a correspondingly high drop in pressure in a partial region of the fluid distribution unit. A uniform distribution process involving the fluid experiencing a minimal dwell period in the fluid distribution unit is thereby fostered in this manner.

By using fluid distribution units or devices in accordance with the invention for a plurality of fluids, a distribution device can be obtained which will ensure a modular construction, preferably incorporating individual replaceable plates.

In particular hereby, a continuous CVD coating can also be ensured in a continuous procedure wherein e.g. sensitive precursors for YBaCuO high-temperature superconductors for example, are being used.

In a particularly preferred embodiment, the fluid outlets for the different fluids are arranged adjacent to one another in alternating manner, preferably along a straight line. In the case of coating processes for example, multiple layers can then be produced in a technically simple continuous process. For example, by using two precursor gas plates, a multi-layer system can be continuously produced from two material components.

It may also be useful in certain circumstances for the distribution of a fluid to be effected by employing a plurality of successively connected fluid distribution units, i.e. preferably by appropriately combining a plurality of plates.

Figure 1B:
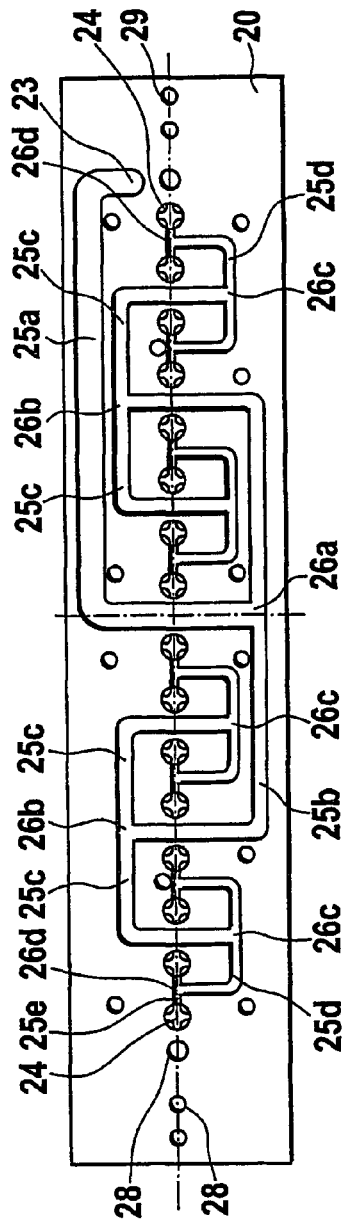
Figure 1C:
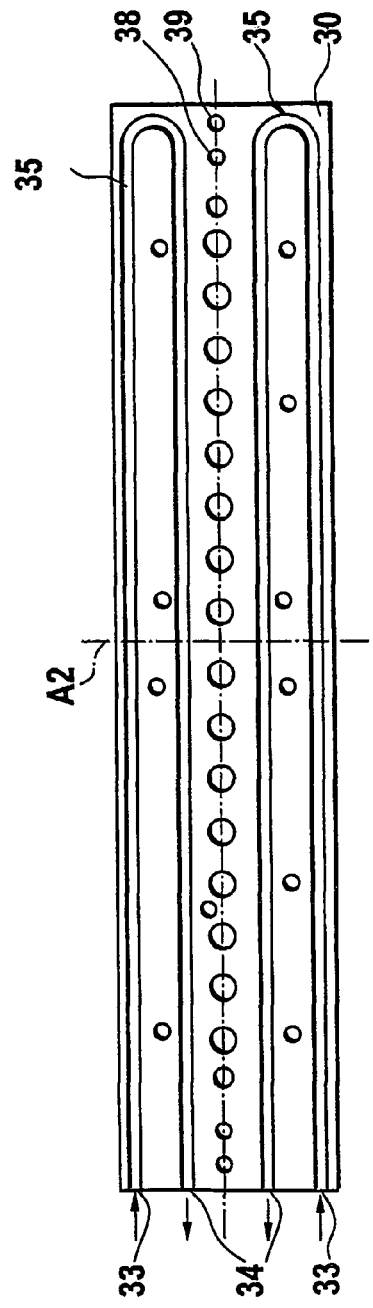
Figure 2:
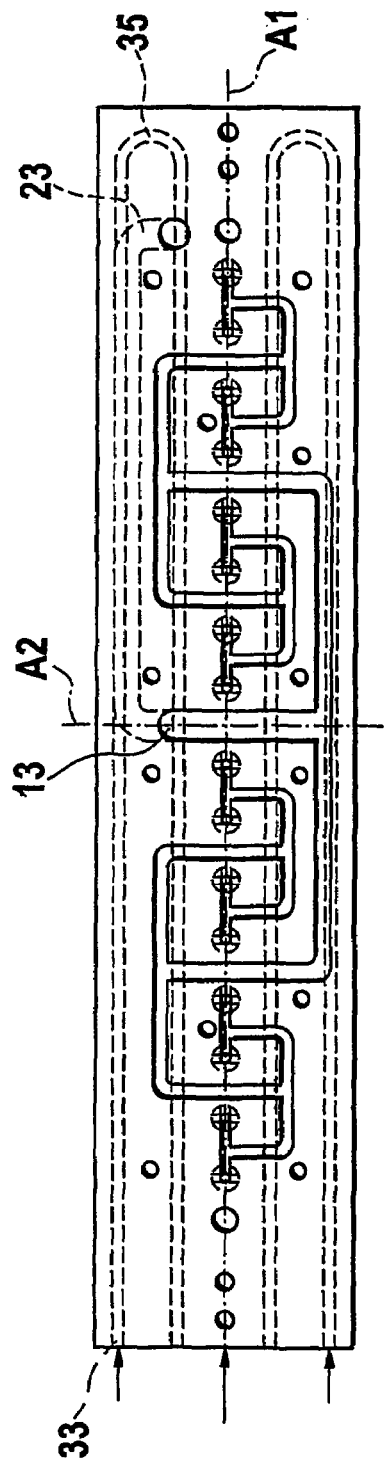
Figure 3:
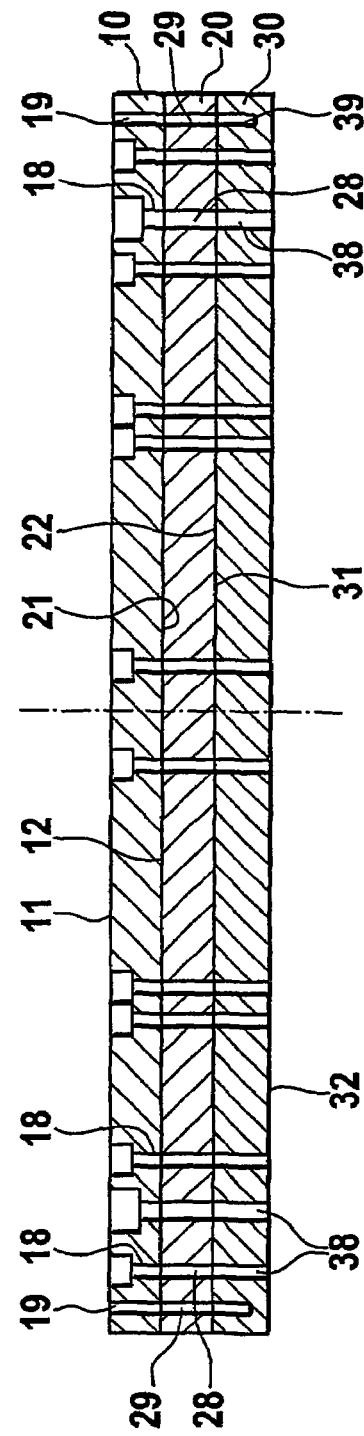
Figure 4A:
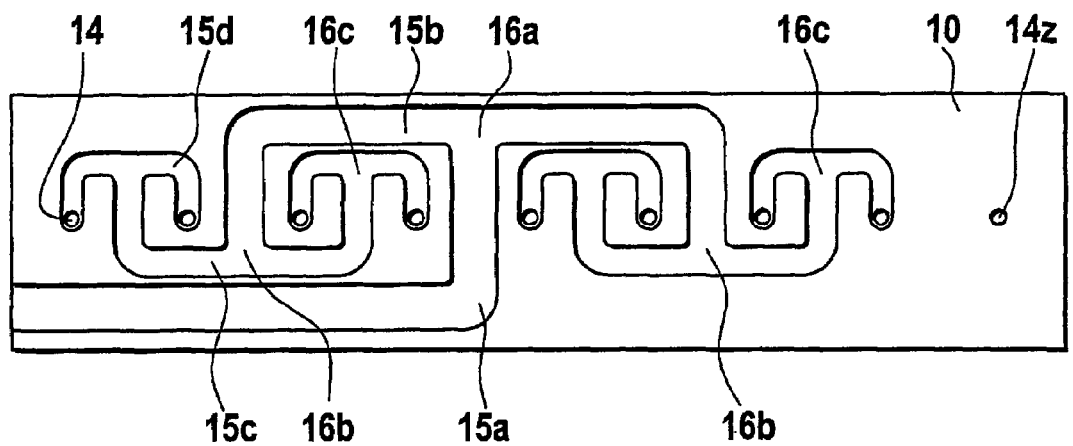
Figure 4B:
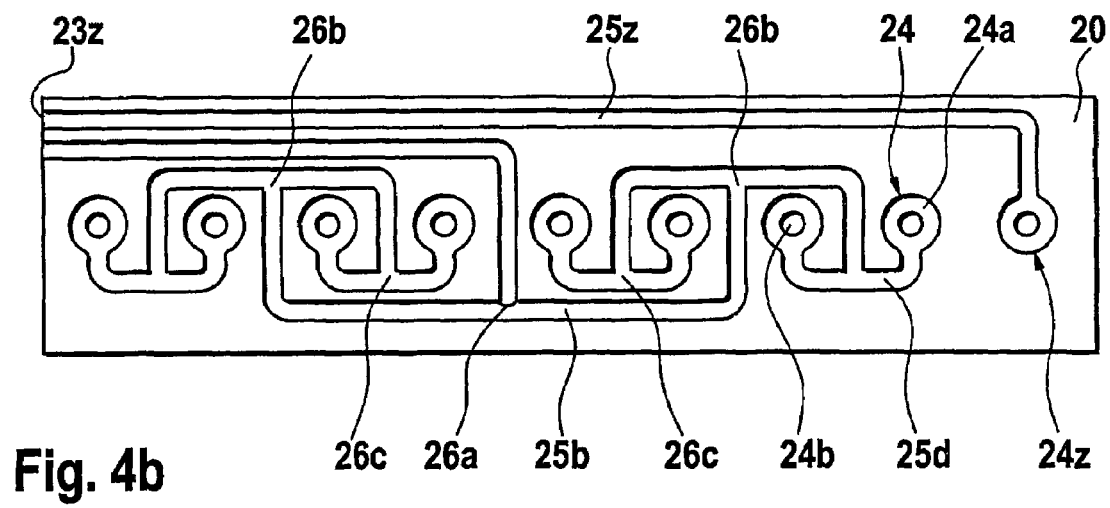
Figure 5:
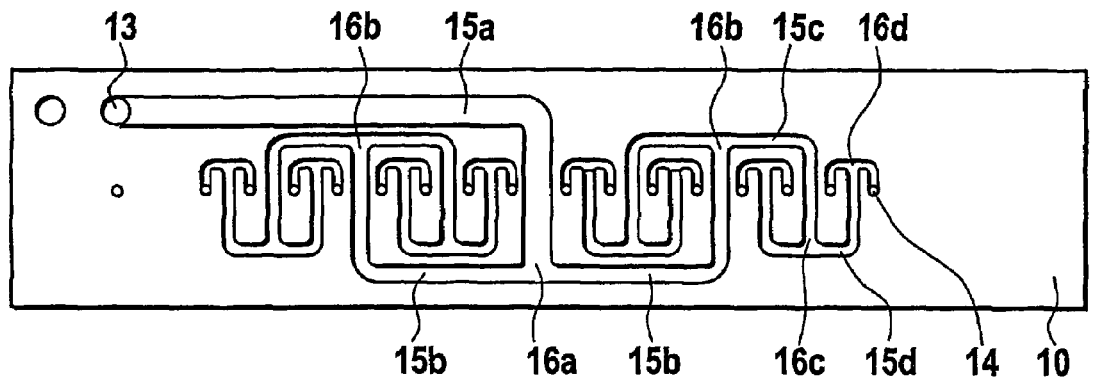
Figure 6:
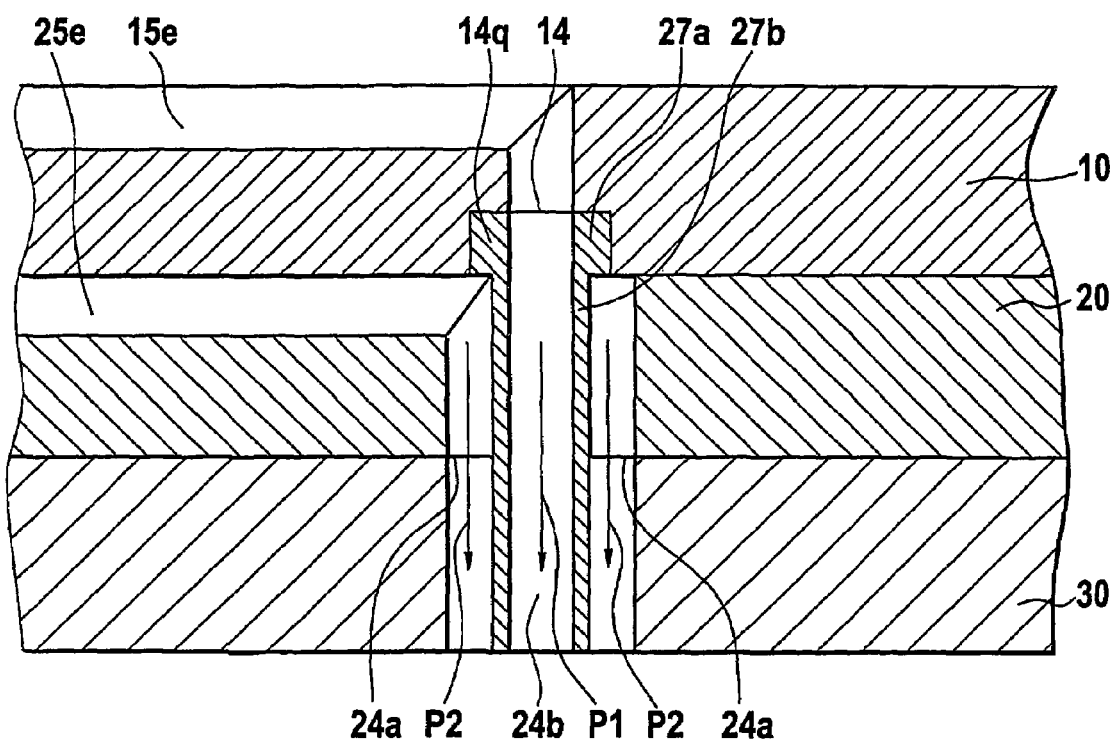
Figure 7:
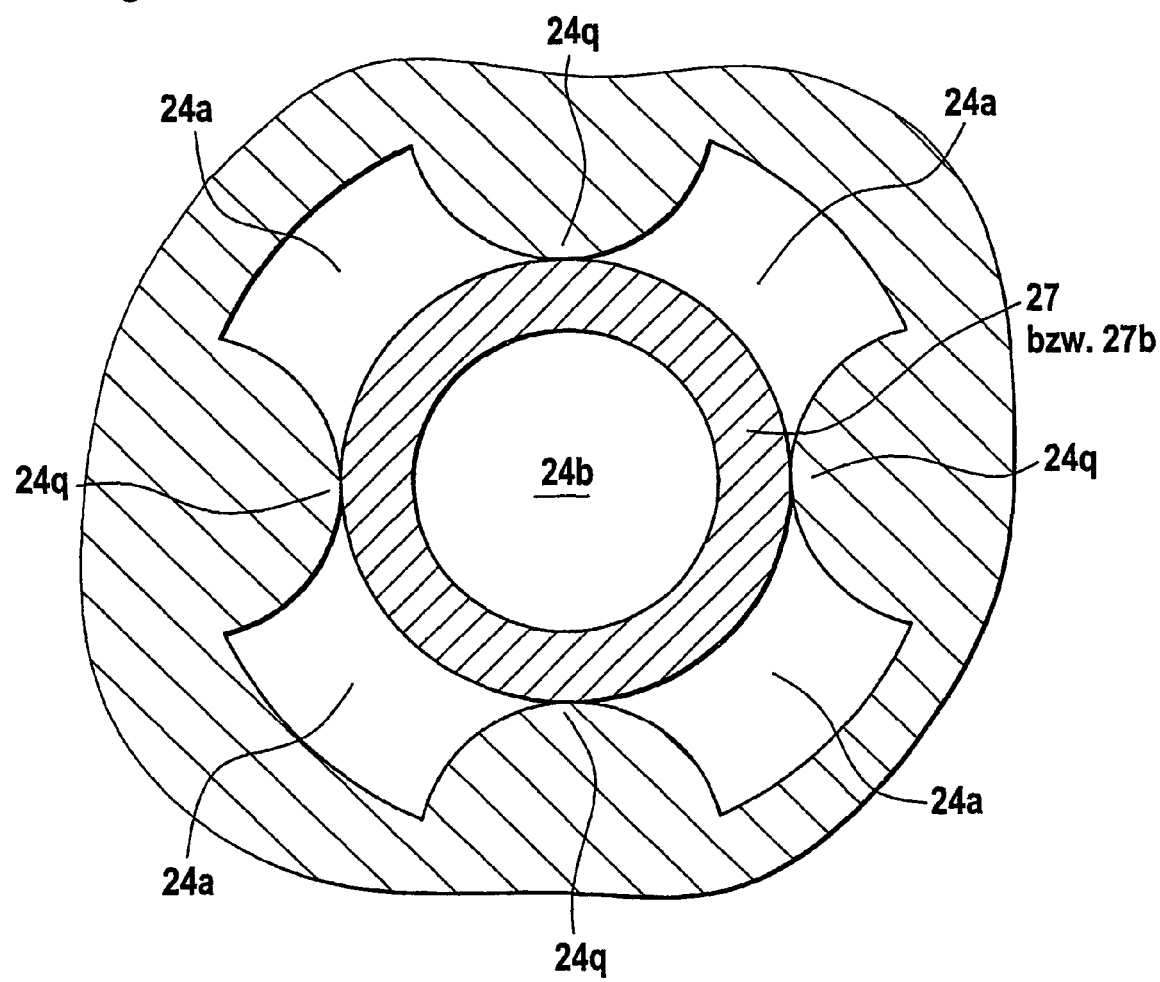

The invention will be explained in more detail hereinafter by means of a few embodiments with the help of the accompanying drawings. Therein FIG. 1 shows an exploded top view of an embodiment of a fluid distribution device in accordance with the invention comprising three partial elements, namely FIG. 1a a first fluid distribution unit in accordance with the invention for a first fluid;

FIG. 1b a second fluid distribution unit in accordance with the invention for a second fluid;

FIG. 1c a temperature controlling device;

FIG. 2 a superimposed i.e. unexploded view of the embodiment illustrated in FIG. 1;

FIG. 3 longitudinal section through the embodiment illustrated in FIGS. 1 and 2;

FIG. 4 another embodiment of a fluid distribution device in accordance with the invention incorporating two partial elements, namely FIG. 4a another first fluid distribution unit in accordance with the invention for a first fluid;

FIG. 4b another second fluid distribution unit in accordance with the invention for a second fluid;

FIG. 5 a top view of a further embodiment of a fluid distribution unit in accordance with the invention;

FIG. 6 part of a section through the fluid distribution device illustrated in FIGS. 1 and 3; and FIG. 7 an enlarged view of a section parallel to the plane of the illustration through the fluid distribution unit illustrated in FIG. 1b in the vicinity of a fluid outlet.

In FIG. 1, a fluid distribution device in accordance with the invention comprises a first fluid distribution unit 10 for distributing a first fluid, a second fluid distribution unit 20 for distributing a second fluid and a temperature controlling device 30 for supplying cooling or heating means thereto. Each of the three partial elements is of approximately plate-like shape and is separately perceptible in FIGS. 1a, 1b and 1c. As a practical example and of proven implementation hereby, a supply device for a CVD coating plant has been chosen although this does not limit the modes of employment. Firstly however, the employment of a fluid distribution device for this purpose in such a coating plant will be explained hereinafter:

In a CVD coating plant, two gases are fed separately from one another into a reaction or coating chamber. One of these is a mixture of gases consisting of a preliminary compound (a so-called precursor) together with a carrier compound which is relatively weakly reactive or even inert. The other gas is a reaction gas. When the precursor and the reaction gas (process gas) meet one another, they react and set free a compound in the precursor gas which is then immediately used for coating a substrate whilst all the other reaction products and various other components are led away.

Hereby, the precursor is frequently a hydrogen compound (hydrosilicon for example) or an organic compound, possibly in the case of ceramic materials, high-temperature superconductors for example, barium-strontium-titanate or strontium-bismuth-tantalate. The precursor gas is fed in a stream of gas towards the heated substrate that is to be coated. The chemical compound in the precursor decomposes on meeting the substrate which is heated to 800° C. for example so that the desired substances, silicon or yttrium-barium-copper for example, will be deposited onto the substrate. For the purposes of producing a ceramic superconductor for example, a suitable partial pressure of oxygen can be established in the coating chamber so that yttrium-barium-copper oxide will be transformed into the desired perovskite structure having the desired stoichiometry. For the purposes of producing a suitable gas stream, a carrier gas or flushing gas may be carried along additionally in the gas mixture which may, for example, contain oxygen as the (subsequent) reaction partner or simply a gas which does not participate in the chemical reaction that is used for producing the desired coating. This gas mixture represent the first fluid which can be distributed with the aid of one of the fluid distribution units in accordance with the invention.

As previously explained, there may be embodiments in which only one fluid needs to be distributed so that in this case only one fluid distribution unit is employed. This is the case for example, when the mere encounter with the 800° C. hot substrate suffices for the desired reaction of the precursor. However, in very many cases, a further reaction gas will be employed which must not come into contact with the precursor prior to the occurrence of the desired reaction directly on the substrate and consequently this gas must be distributed separately although as uniformly as possible and should be set free in the direct vicinity of the precursor (i.e. now, the first fluid). This reaction or process gas could also be a mixture of gases or even a liquid and it now forms the second fluid. It is conceivable, although rare in practice, for third reaction partners to be employed and these would then be distributed in a similar manner as a third fluid (not illustrated here).

The first fluid distribution unit 10 in FIG. 1a is produced from a metal, for example, aluminium, copper, brass or steel. It has a plate-like shape and comprises an upper surface 11 and a lower surface 12. Various channels 15 and branches 16 are provided in the form of grooves in the upper surface 11 or in the lower surface 12 of the fluid distribution unit 10. These grooves could be milled in subsequently or be formed during the process of manufacturing the plate.

Hereinafter, we will deal with the construction of the depicted structure on the upper surface 11 which is in turn covered by a further plate-like structure in such a manner that only the fluid supply means will remain free, this being capable of being closed externally. As an alternative hereto, the channels and the branches could also be formed in the lower surface 12 of the plate-like fluid distribution unit 10 and then covered by the second fluid distribution unit 20.

A first channel 15a extends in a centrally located, longitudinally lengthwise position of the fluid distribution unit 10. A fluid inlet 13, a through hole for example, is formed at the beginning of the channel if the supply of fluid, i.e. the supply of the precursor in the example being explained, is effected from the upper surface 11 of the first fluid distribution unit 10.

The first channel 15a terminates, as indicated at the bottom of FIG. 1a, in a first branch 16a which is T-shaped and leads at right angles to two second channels 15b. Following a respective right-angled curve, the two second channels 15b extend to a respective T-shaped second branch 16b which in turn becomes two i.e. a total of four, third channels 15c. Following a right-angled curve via T-shaped right-angled third branches 16c, the third channels 15c lead to fourth channels 15d which in corresponding manner again become fifth channels 15e after a right-angled third curve via T-shaped right-angled fourth branches 16d. The fifth channels 15e terminate in fluid outlets 14 at the end of a short path.

Hereby, the fluid outlets 14 extend along a straight-line which advantageously forms the longitudinal axis of the first fluid distribution unit 10 as depicted in FIG. 1a. The two first channels 15a are similar i.e. they are mutually reflected about the transverse axis A2 as depicted in FIG. 1a. The third channels 15c and the fourth channels 15d are also mutually similar or symmetrically similar. The fifth channels 15e are likewise similar to one another, the streams therein simply flowing in different directions. There is thus provided a symmetrical system of channels which is advantageously mirror symmetrical about a transverse axis of the first fluid distribution unit 10 wherein each connection from the fluid inlet 13 to one of the fluid outlets 14 comprises similar channels 15 and the respective succeeding channels which are in each case similar i.e. they are mutually mirror symmetrical in each case. The branches 16 present at each of the partial paths are also similar, namely they merely differ in regard to the direction in which the stream is deflected. Hereby however, in the case of the top view shown in FIG. 1a, it is ensured that the same flow conditions will occur in each branch 16 both for the partial fluid stream which is branched off to the left at a T-shaped branch 16 and for the corresponding branch branching off to the right. Hereby, the spacings of the curves to the respective T-shaped branches 16 are advantageously made sufficiently large when forming the curves into the respective channels 15 and, in consequence, by virtue of the sufficiently small cross-section of the channels, a uniform flow will enter the branch 16 wherein turbulences ensuing from the preceding curves will not occur.

The connections from the fluid inlet 13 to the individual fluid outlets 14 achieved hereby are relatively long compared with the actual separation thereof in order to ensure unified lengths for the respective connections and unified geometrical constructions. In accordance with the invention however, the increase in the length of the transportation path for the fluid stream is accepted in order to achieve uniform conditions in each connection. Due to the fact that the fluid distribution units 10, 20 are formed with channels 15 in a metal plate as depicted in FIGS. 1a, 1b, accurate control of the temperature and hence setting of a uniform temperature can also be ensured over this relatively long path. Due to the fact that a continuous channel system is formed in accordance with the invention, a continuous stream of fluid can thus be ensured by appropriate control of the temperature so that deposits on the walls of the channels can generally be avoided, in contrast to the case of the intermediate containers used in the state of the art.

A type of meandering interlaced structure is thereby obtained wherein, by virtue of the four branches, $2^4$ i.e. 16 fluid outlets 14 can be uniformly supplied with the first fluid i.e. a precursor gas or a gas mixture perhaps. According to FIG. 1a, the fluid outlets 14 are uniformly spaced along the longitudinal axis A1.

As can be perceived from FIG. 1b, the channels in the second fluid distribution unit 20 are formed in a corresponding manner. The supply of the second fluid (i.e. the reaction or process gas in the example under discussion) to a fluid inlet 23 in the second fluid distribution unit 20 is effected via a duct 17 in the first fluid distribution unit 10. The channels 25 are then provided with branches 26 to the fluid outlets 24. Following two right-angled curves corresponding to the construction described hereinabove with reference to FIG. 1a, a first channel 25a leads to a first branch 26a. The individual connections to the fluid outlets 24 are again effected via second channels 25b, T-shaped second branches 26b, third channels 25c, T-shaped third branches 26c, fourth channels 25d, T-shaped fourth branches 26d, and fifth channels 25e.

A more detailed illustration and description of the fluid outlets 24 and hence of the way in which the two fluid are brought together thereat will be given hereinafter in connection with FIG. 5.

Below the second fluid distribution unit 20, FIG. 1c depicts a likewise plate-like temperature controlling device 30 having an upper surface 31 and a lower surface 32 in which there are formed temperature controlling channels 35 for a temperature controlling medium i.e. a cooling and/or heating medium such as a gas or a liquid such as water or oil for example. Advantageously, the supply of the temperature controlling means to the two temperature controlling channels 35 is effected symmetrically, namely, as is shown in FIG. 1, via external lines to the temperature controlling channel inputs 33 and the discharge of the temperature controlling means via internal temperature controlling channel outlets 34 which are located between the temperature controlling channel inputs 33, or vice versa.

The channels 25 and branches 26 of the second fluid distribution unit 20 are covered by the not shown lower surface 12 of the first fluid distribution unit 10. In the event that as an alternative thereto the channels are formed in the lower surfaces 12, the channels of the first fluid distribution unit 10 are covered by the second fluid distribution unit 20 and the channels of the second fluid distribution unit 20 are covered by the temperature controlling device 30, a further covering for the temperature controlling channels 35 of the temperature controlling device 30 being provided.

The through-view of FIG. 2 shows, in superimposed manner, the course of the different channels 15, 25, 35 relative to one another. The generally superimposed construction which substantially simplifies a modular type of configuration for the different fluid distribution units 10, 20 is readily perceptible therefrom.

In accordance with FIG. 3, the plates of the fluid distribution units 10 and 20 and the temperature controlling device 30 can be connected by bolts which are fed through aligned connecting holes 18, 28 and 38 in the plates. Centring pins could be inserted into the centring borings 19, 29, 39 for the purposes of centralising the arrangement.

The lower surface 32 of the temperature controlling device 30 may be provided with a coating for insulating or radiation reflecting purposes, a layer of silver for example.

Thus, a modular construction using metal plates that are relatively easy to construct is provided wherein sealing of the respective channels 15, 25, 35 is effected by the other modular units.

In another embodiment shown in FIG. 4, just first, second and third branches 15a, 15b and 15c are formed in the first fluid distribution unit 10 (FIG. 4a) so that merely $2^3$ i.e. eight fluid outlets 14 for the first fluid are connected to the fluid inlet 13.

The same applies for the second fluid distribution unit 20 (FIG. 4b). Here too, just first second and third branches 25a, 25b and 25c are formed so that merely $2^3$ i.e. eight fluid outlets 24 for the second fluid are connected to the fluid inlet 23.

A separate and non-distributing duct for a further fluid, another precursor for example, which is supplied from above and discharged at the bottom is indicated in FIG. 4a. Moreover, as can be seen in FIG. 4b, a further fluid outlet 24z, which is connected via a separate channel 25z to a special fluid inlet 23z, is provided at the beginning or the end of a processing section. This represents a coaxial gas supply means which matches the duct 14z from the first fluid distribution unit 20. By using these additional elements 14z, 23z, 24z, 25z in a CVD plant, a second layer of material can be deposited onto a belt being drawn continuously therebelow.

The fluid outlets 24 of the second fluid distribution unit 20 shown in FIG. 4b comprise an annular outer region 24a for forming the stream of second fluid which surround an inner region 24b through which the ducts 27 for the first fluid extend.

Thus, ducts 27 are formed through the second fluid distribution unit 20, said ducts being accommodated in the inner regions 24b of the fluid outlets 24 and discharging the first fluid which is being discharged by the first fluid distribution unit 10 into the fluid outlets 14 and is then fed directly through these ducts 27 into the second fluid distribution unit 20. The outer regions 24a serve for discharging the second fluid i.e. the reaction gas for example, which was fed thereto separately from the first fluid i.e. the precursor gas stream for example. A gas stream consisting of the two fluids that is directed at the substrate is thus formed, these fluids now executing the desired reactions by virtue of this movement and enabling them to be concluded in a manner specifically attuned to the substrate.

FIG. 5 shows a further possible construction of a fluid distribution unit 10 or 20 comprising first, second, third and fourth branches 16 and thus $2^4$ i.e. sixteen fluid outlets 14 that are uniformly filled with fluid.

In accordance with the enlarged detail shown in FIG. 6, the fluid outlet 14 of the fluid distribution unit 10 of FIG. 1a—and also the corresponding fluid outlets 14 of the other embodiments—may be formed with an enlarged cross-section 14q at its lower end into which an end 27a of the duct 27 is inserted. The shaft 27b of the duct 27 extends, in accordance with FIG. 6, through the fluid outlets 24 so that merely an outer region 24a of the fluid outlets 24 is supplied with the second fluid. Consequently, the first fluid is fed downwardly through the inner region 24b by the duct 27 for the fluid outlet 14 (indicated by-an arrow P1 in FIG. 8), whereas the second fluid is fed externally thereof in coaxial manner in accordance with the arrow P2.

One way of stabilising the duct 27 is provided by means of centring noses 24q on the lower surface 22 of the fluid unit as is illustrated in FIG. 7.

As an alternative to the embodiments depicted here, Y-shaped branches 16 and 26 located in a plane or even branches 16, 26 that are not located in a plane could be used. Hereby, for example, a ducting of the respective fluid stream may be effected from the upper surface 11, 21 to the lower surface 12, 22 using three successive channels 15, 25 for example.

In this way, a single fluid inlet can be distributed to a number of fluid outlets which form the product of a power of two and a power of three (for example: 2, 3, 4, 6, 8, 9, 12, 16, 18).

LIST OF REFERENCE CHARACTERS

10 first fluid distribution unit
11 upper surface of the first fluid distribution unit
12 lower surface of the first fluid distribution unit
13 fluid inlet of the first fluid distribution unit
14 fluid outlets of the first fluid distribution unit
 14q widening of the cross-section of the fluid outlet
 14z separate fluid passage in the embodiment of FIG. 4
15 channels in the first fluid distribution unit
 15a first channel
 15b second channel
 15c third channel
 15d fourth channel
 15e fifth channel
16 branches of the channels in the first fluid distribution unit
 16a first branch
 16b second branch
 16c third branch
 16d fourth branch
17 duct for the second fluid in the first fluid distribution unit
18 connecting holes in the first fluid distribution unit
19 centring borings in the first fluid distribution unit
20 second fluid distribution unit
21 upper surface of the second fluid distribution unit
22 lower surface of the second fluid distribution unit
23 fluid inlet of the second fluid distribution unit
 23z additional fluid inlet in the embodiment of FIG. 4b
24 fluid outlets of the second fluid distribution unit
 24a outer region of the fluid outlets
 24b inner region of the fluid outlets
 24q centring noses in FIG. 7
 24z additional fluid outlet in the embodiment of FIG. 4b
25 channels in the second fluid distribution unit
 25a first channel
 25b second channel
 25c third channel
 25d fourth channel
 25e fifth channel
 25z additional channel in the embodiment of FIG. 4b
26 branches of the channels in the second fluid distribution unit
 26a first branch
 26b second branch
 26c third branch
 26d fourth branch
27 duct
 27a end of the duct
 27b shaft of the duct
28 connecting holes in the second fluid distribution unit
29 centring borings in the second fluid distribution unit
30 temperature controlling device
31 upper surface of the temperature controlling device
32 lower surface of the temperature controlling device
33 temperature controlling channel inlets
34 temperature controlling channel outlets
35 temperature controlling channels
38 connecting holes in the temperature controlling device
39 centring borings in the temperature controlling device
A1 longitudinal axis of the fluid distribution unit
A2 transverse axis of the fluid distribution unit
P1 arrow for indicating the direction of movement of the first fluid
P2 arrow for indicating the direction of movement of the second fluid

The invention claimed is:

1. A fluid distribution unit for dividing a stream of fluid into a plurality of partial streams, the fluid distribution unit including at least one fluid inlet for the incoming stream of fluid, a plurality of fluid outlets for the partial streams, and a plurality of channels which connect the fluid inlet to the fluid outlets, wherein the channels divide into respective branches in symmetrical manner in succeeding channels, wherein successive branches alternate in opposed directions and wherein each connection from the fluid inlet to one of the fluid outlets comprises similar channels and similar branches.

2. The fluid distribution unit of claim 1 wherein said plurality of channels comprises a first channel for receiving the incoming stream of fluid from said fluid inlet; and wherein said first channel divides into a plurality of second channels, each of the second channels being in communication with one of said fluid outlets.

3. The fluid distribution unit of claim 2 wherein the first and second channels are formed in a planar structure that lies in a plane perpendicular to a duct that defines an outlet direction of said fluid outlets.

4. A fluid distribution assembly for separately distributing two or more different fluids, said fluid distribution assembly comprising:
 at least two fluid distribution units each for dividing an incoming stream into a plurality of partial streams;
 means for layering the two fluid distribution units in an adjacent planar flat array;
 each said fluid distribution unit including;
  a fluid inlet for receiving the incoming stream of fluid;
  a plurality of fluid outlets for emitting the partial streams;

a plurality of channels interconnecting said fluid inlet with said fluid outlets;
wherein said plurality of channels comprises a first channel for receiving the incoming stream of fluid from said fluid inlet; and
wherein said first channel divides into a plurality of second channels, each of the second channels being in communication with one of said fluid outlets;
and a duct that extends orthogonal to the plane of said fluid distribution units for coupling an outlet of a first fluid distribution unit through a second fluid distribution unit to an outlet port.

5. The fluid distribution assembly of claim 4, wherein the first and second channels lie in a plane perpendicular to an outlet direction of said fluid outlets.

6. The fluid distribution assembly of claim 4, wherein the fluid distribution unit is in plate form, and wherein each of the second channels divide into further pairs of channels in communication with said fluid outlets.

7. The fluid distribution assembly of claim 6, wherein said channels are in the form of grooves in a surface of said fluid distribution units and are covered by a second plate.

8. The fluid distribution assembly of claim 4 wherein the second plate comprises a second distribution unit.

9. The fluid distribution assembly of claim 4, wherein each of said second channels divides symmetrically into at least two succeeding channels.

10. The fluid distribution assembly of claim 4, wherein said channels divide at successive reversed right angles.

11. The fluid distribution unit assembly of claim 4, wherein said channels comprise a selected one of straight portions only, and straight portions including successive reversed right-angled curves.

12. The fluid distribution assembly of claim 4, wherein said fluid outlets lie in a straight line.

13. The fluid distribution assembly of claim 4, wherein flow of the fluid exhibits at least one of a pressure gradient which varies by less than ±20% and a flow resistance which varies by less than ±20%.

14. The fluid distribution assembly of claim 4, wherein the fluid outlets for the first fluid and the fluid outlets for the second fluid are concentric by means of said duct that defines inner and outer regions for the respective flow of the separate fluids.

15. The fluid distribution assembly of claim 4, and further comprising a temperature controlling device for fluid cooling and heating purposes adjacent at least one of the fluid distribution units.

16. The fluid distribution assembly of claim 15, wherein the temperature controlling device is of plate-like structure and wherein a radiation reflecting layer, is provided on a surface of the temperature controlling device.

17. The fluid distribution assembly of claim 15, wherein the fluid distribution units and the temperature controlling device are provided with aligned securing boles for accommodating connecting bolts.

18. The fluid distribution assembly of claim 4, wherein the fluid outlets for the different fluids are located adjacent to one another.

19. The fluid distribution assembly of claim 4, wherein the assembly comprises a supply device for gases for a CVD coating plant, wherein at least one of the fluid distribution units is provided for at least one precursor gas and a carrier gas and wherein at least one of the fluid distribution units is provided for at least one reactive gas.

20. The fluid distribution assembly of claim 4 wherein the unit comprises a planar structure of a metal exhibiting high thermal conductivity.

21. The fluid distribution assembly in accordance with claim 4 wherein the fluid flowing in the unit exhibits at least one of a substantially uniform pressure gradient and a substantially uniform resistance to flow.

22. A fluid distribution unit for dividing a stream of fluid into a plurality of partial streams, said fluid distribution unit comprising:
at least one fluid inlet for the incoming stream of fluid;
a plurality of fluid outlets for the partial streams;
and a plurality of channels which connect the fluid inlet to the fluid outlets;
wherein the channels divide into respective branches in symmetrical manner in succeeding channels;
wherein said plurality of channels is defined by a planar member in which the channels extend in substantially the same plane;
and wherein the channels lie in a plane perpendicular to an outlet direction of said fluid outlets.

23. The fluid distribution unit of claim 22 wherein successive branches alternate in opposed directions and wherein each connection from the fluid inlet to one of the fluid outlets comprises similar channels and similar branches that are defined by grooves in a surface of the planar member.

24. The fluid distribution unit of claim 23 wherein said plurality of channels comprises a first channel for receiving the incoming stream of fluid from said fluid inlet; and wherein said first channel divides into a plurality of second channels, each of the second channels being in communication with one of said fluid outlets and wherein the first and second channels are formed in the planar member that lies in a plane perpendicular to a duct that defines an outlet direction of said fluid outlets.

* * * * *